(12) United States Patent
Okhmatovski et al.

(10) Patent No.: US 10,302,684 B2
(45) Date of Patent: May 28, 2019

(54) METHOD FOR DETERMINING ELECTRIC FIELD AND RELATED APPLICATIONS

(71) Applicant: University of Manitoba, Winnipeg (CA)

(72) Inventors: Vladimir Okhmatovski, Narol (CA); Farhad Seikh Hosseini, Winnipeg (CA)

(*) Notice: Subject to any disclaimer, the term of this patent is extended or adjusted under 35 U.S.C. 154(b) by 119 days.

(21) Appl. No.: 15/487,125

(22) Filed: Apr. 13, 2017

(65) Prior Publication Data

US 2017/0299643 A1 Oct. 19, 2017

Related U.S. Application Data

(60) Provisional application No. 62/322,045, filed on Apr. 13, 2016.

(51) Int. Cl.
*G06F 11/30* (2006.01)
*G01R 29/08* (2006.01)

(52) U.S. Cl.
CPC .................. *G01R 29/08* (2013.01)

(58) Field of Classification Search
CPC ....................................................... G01R 29/08
See application file for complete search history.

(56) References Cited

U.S. PATENT DOCUMENTS

2014/0236551 A1* 8/2014 Vold .................... G06F 17/5018
703/2

* cited by examiner

*Primary Examiner* — Phuong Huynh
(74) *Attorney, Agent, or Firm* — Ryan W. Dupuis; Ade + Company Inc.; Kyle R. Satterthwaite

(57) ABSTRACT

A method for calculating electric field having contributions of an incident electric field from a source and an electric field emitted from another object distinct from the source but in a path of the incident electric field, which is often termed a "scatterer". This method is formed by a new single-source integral equation which represents the electric field inside the scatterer as a superposition of spherical waves emanating from its boundary. Calculation of electric field using this method is particularly but not exclusively suited for applications such as fault detection in simulations of power systems, remote sensing of stratified structures such as ice, and circuit design concerning chips in electronic packages on circuit boards.

29 Claims, 10 Drawing Sheets

METHOD FOR DETERMINING ELECTRIC FIELD AND RELATED APPLICATIONS

This application claims the benefit under 35 U.S.C. 119(e) of U.S. provisional application Ser. No. 62/322,045 filed Apr. 13, 2016 which is incorporated herein by reference.

FIELD OF THE INVENTION

The present invention relates to a method for calculating electric field having contributions of an incident electric field from a source and an electric field emitted from another object distinct from the source but in a path of the incident electric field, which is often termed a "scatterer", and using that calculated electric field in various applications.

BACKGROUND

Integral equations of electromagnetics present a powerful theoretical foundation for solution of the problems of scattering and radiation of electromagnetic waves on complex penetrable, impenetrable and composite structures. Such problems are fundamental in many practical applications such as antenna design, analysis of microwave circuits, prediction of signal propagation of high-speed interconnects, stealth technology and many others. The key advantages offered by the integral equation solutions compared to the direct solution of the differential equations of electromagnetics as described in J.-M. Jin, 2002 and A. Taflove et al., 2005 include (i) localization of the unknown field quantities to the boundaries of the analyzed structures instead of their volumes as discussed in A. Peterson et al., 1998; (ii) exact evaluation of the wave propagation over long distances as discussed in W. C. Chew et al., 2001; and (iii) possibilities for abstraction of a complex environment surrounding the objects such as stratified media as discussed in W. C. Chew, 1999.

Previously known types of the integral equations in electromagnetics include the surface integral equation formulations for the piece-wise homogeneous penetrable and impenetrable scatterers such as electric field integral equation (EFIE), magnetic field integral equation (MFIE), combined field integral equation (CFIE), Poggio-Miller-Chang-Harrington-Wu-Tsai (PMCHWT) and Muller equations; volume integral equations for inhomogeneous penetrable scatterers (W. C. Chew et al., 2001); and single-source integral equations (SSIEs) as discussed in D. Swatek, 1999 and Z. G. Qian et al, 2007. Stable variants of the above equations enabling and improving the above-listed classical formulations at low-frequencies as discussed in Z. G. Qian et al., 2009; Z. G. Qian, 2009; M. Taskinen et al., 2006; W. Wu et al., 1994; J. Zhao et al., 2000; and K. Cools, 2011; in the presence of high disparity of the material properties as discussed in P. Yl-Oijala et al., 2005 and J. Markkanen et al., 2012, under conditions of oversampling as discussed in F. Valdes et al., 2008, and in the presence of stratified media discussed in K. A. Michalski et al., 1990 and A. Kishk et al., 1986 have also been developed. In this work we introduce a new type of a single-source integral equation by combining the ideas of surface integral representation of the electromagnetic field developed in the theory of the single-source integral equations and the traditional volume equivalence principle.

The classical surface integral equations on penetrable objects are derived through application of either the surface equivalence principle or through application of the Green's theorem to the volumes inside and/or outside the scatterer. Both approaches lead to the same expressions of the electromagnetic field inside and outside the scatterer regions as discussed in C. T. Tai, 1994. These surface integral expressions can be viewed as superpositions of the electric and magnetic types of elementary spherical waves emanating from the region boundaries and weighed by the tangential components of the true electromagnetic field, commonly referred to as the equivalent electric and magnetic currents. As such, the electromagnetic field inside a source-free region of the scatterer is expressed as a superposition of the two types of waves produced by the electric and magnetic dipoles situated on the boundary, both types of waves satisfy the same homogeneous curl-curl equation as the field they produce as a result of their superposition. Two questions then arise in the process of traditional surface integral equation derivation:
1) Is it necessary to include both types of the waves into the superposition in order to obtain the correct field representation or taking only one type of wave (waves of only the electric currents or waves of only the magnetic currents) suffices?
2) Must the strengths of the electric and magnetic dipoles situated at the boundary be determined by the true values of the tangential components of the fields themselves on the boundary?

The classical equivalence principle gives us the affirmative answer to both of these questions as discussed in R. Harrington, 1993. The only exception to these rules within the equivalence principle come from the possibilities of eliminating one type of the sources at the expense of making the waves of the other type more complicated. For example, one could take only the fields of the magnetic point sources in the presence of the PEC enclosure formed by the boundary of the object and eliminate the contribution from the equivalent electric currents. The magnitudes of the magnetic dipoles however still must be determined by the values of the tangential component of the true electric field on the boundary of the object.

It turns out, however, that neither of the above two requirements are necessary and greater flexibility in the integral representations of the field is possible than that prescribed by the classical equivalence principle. The breakthrough understanding of this fact came with the paper of D. Maystre and P. Vincent, 1972 who showed that:
1) The weights of the electric and/or magnetic dipoles on the surface of the scatterer do not have to be determined by the tangential components of the true electric and magnetic fields. They can be some arbitrary surface vector functions, i.e. fictitious currents. The only requirement on those fictitious currents is that the superposition of the waves they radiate must add up to the true field at every point throughout the scatterer.
2) It is possible to represent the true field inside a scatterer as either superposition of only the electric dipole fields in free space or only the magnetic dipole fields in free space. Indeed, the combination of the two with arbitrary weights is possible as well. In other words, for as long as the field is build from the waves satisfying the same homogeneous wave equation throughout the volume as the sought field, such representation is able to reproduce the true field. For the concept to be practical though, the question of how to find the magnitudes of the fictitious current sources producing such waves would still remain to be answered.

In D. Maystre and P. Vincent, 1972, it was proposed to determine the fictitious currents through substitution of their integral field representations into the classical surface equivalence principle. Such substitution forms a traditional single source integral equation with respect to the unknown fictitious current density and constrains the latter. In this work we take a different approach. We constrain the fictitious currents through the volume equivalence principle instead. Namely, we substitute the superposition of the waves produced by the fictitious current into the volume equivalence principle. Traditionally, the volume EFIE with respect to the polarization current is enforced throughout the entire volume of the scatterer due to the volumetric polarization current being unknown in the volume. In the case of field representation as a superposition of the waves produced by a single fictitious current source, the unknown function is a tangential vector function localized to the surface of the scatterer. As a result, upon the substitution of the superposition field representation into the V-EFIE it is sufficient to enforce the latter only at the boundary of the scatterer and only for the tangential component of the total field. Such constraining of the single fictitious current on the scatterer boundary through enforcement of the volume integral equation at the boundary of the scatterer for the tangential component of the field produces a new type of integral equation which we term as the Surface-Volume-Surface (SVS) EFIE. The name of the new equation stems from the occurrence in it of the field translations from the surface of the scatterer to its volume and subsequently from the volume back to the surface.

Previously, as discussed in Menshov et al., 2013, Okhmatovski et al., 2016, and F L. S. Hosseini et al., 2016, the SVS-EFIE has been derived for the scalar and vector cases of 2D scattering under TM-polarization and TE-polarization, respectively.

SUMMARY OF THE INVENTION

According to a first aspect of the invention there is provided a method of determining electric field in relation to a three-dimensional object having a prescribed boundary using an electric field integral equation, the method including:

representing the electric field integral equation as a single source integral equation which uses one or both of electric type waves and magnetic field type waves emanating from the boundary of the object weighted by a single function defined on the boundary;

using the electric field integral equation to solve for the electric field.

Preferably the method includes a step of deriving the single source integral equation using a volume electric field integral equation by translating said one or both of the electric type waves and the magnetic field type waves from the boundary to a volume of the object and back to the boundary of the object.

In other words, the method preferably includes a step of deriving the single source integral equation from a volume electric field integral equation by representing total electric field inside the boundary of the object as a superposition of said one or both of the electric type waves and the magnetic field type waves emanating from the boundary of the object.

Preferably the electric type waves comprise an electric field produced by an electric dipole and the magnetic field type waves comprise a magnetic field produced by an electric dipole.

In one arrangement only the electric type waves are used in representing the electric field integral equation.

In another arrangement both of the electric type waves and the magnetic type waves are used in representing the electric field integral equation.

Preferably the single function is a tangential vector function defined on the boundary.

According to another aspect of the invention there is provided a method of evaluating an electrical disturbance within a power system comprising a power conductor supported by a supporting infrastructure, the method comprising:

calculating the electric field according to the forgoing method described in relation to the first aspect of the invention in which the three-dimensional object comprises the supporting infrastructure;

locating any faults in the power system by calculating charge distribution in the power system using the calculated electric field.

Preferably the method further includes a step of modifying the power system to correct for any faults located.

According to yet another aspect of the invention there is provided a method of remote sensing a stratified structure using a radar wave emanating from a satellite and propagating through the stratified structure, the method comprising:

calculating the electric field according to the forgoing method described in relation to the first aspect of the invention in which the three-dimensional object comprises the stratified structure; and identifying a configuration of layers within the stratified structure using the calculated electric field.

For example the stratified structure includes a layer of ice.

According to a further aspect of the invention there is provided a method of designing a circuit comprising a processor chip communicating with a circuit board using an electronic package of conductive wires, the method including:

calculating the electric field according to the forgoing method described in relation to the first aspect of the invention in which the three-dimensional object comprises conductive wires of the electronic package; and identifying communication rate limitations in the circuit using the calculated electric field.

Preferably the method further comprises a step of modifying a configuration of the circuit to overcome the identified communication rate limitations.

The method may further comprise a step of modifying the configuration of the circuit by re-routing the conductive wires of the electronic package.

The method may further comprise a step of modifying the configuration of the circuit by providing electromagnetic shielding between some of the conductive wires.

The new surface-volume-surface electric field integral equation (SVS-EFIE) of the present invention is abbreviated as 3D-SVS-EFIE for convenience of reference throughout this disclosure.

BRIEF DESCRIPTION OF THE DRAWINGS

Arrangements of the invention will now be described in conjunction with the accompanying drawings in which.

In the drawings like characters of reference indicate corresponding parts in the different figures.

DETAILED DESCRIPTION

Figure 1:
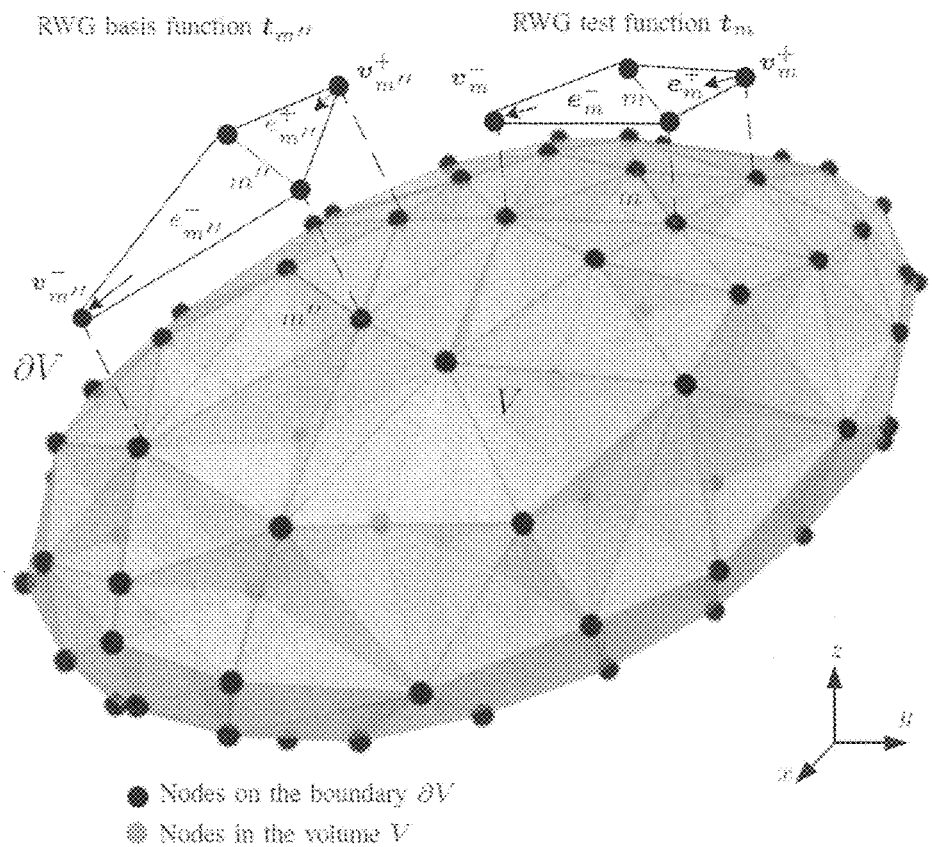
FIG. 1 illustrates a tetrahedral volume mesh and triangle surface mesh utilized in the Method of Moments (MoM) solution of the 3D-SVS-EFIE (indicated at equation 10) and Rao-Wilton-Glisson (RWG) basis functions on $\partial V$.

In this disclosure is described a generalization of the SVS-EFIE formulation to 3D scattering problem is presented and its Method of Moment solution.

3D-SVS-EFIE Formulation

Consider the equivalence principle expression written for time-harmonic electric field E with cyclic frequency ω in source-free volume V occupied by a non-magnetic homogeneous scatterer of relative permittivity ∈

$$-i\omega\mu_0 \int_{\partial V} \overline{\overline{G}}_{e\in}(r,r') \cdot J^e(r')ds' + \int_{\partial V} \overline{\overline{G}}_{m\in}(r,r') \cdot J^m(r')ds' = \begin{cases} E(r), & r \in V - \partial V, \\ 0, & r \in V_\infty - \partial V, \end{cases} \quad (1)$$

where r and r' the position-vectors of observation and source points is $J^e$=n̂×H is the equivalent electric current defined on the boundary ∂V. $J^m$=−n̂×E is the equivalent magnetic current defined on ∂V, and $\overline{\overline{G}}_{e\in}$(r,r') is the homogeneous non-magnetic medium dyadic Green's function defined as $$\overline{\overline{G}}_{e\in}(r,r') = \left(\frac{\nabla\nabla}{k_\in^2} + \overline{I}\right) G_\in(r,r'). \quad (2)$$

In (2), $$G_\in(r,r') = \frac{e^{-1k_\in|r-r'|}}{4\pi|r-r'|}$$

is the 3D Green's function of homogeneous non-magnetic medium, $k_\in=k_0\sqrt{\in}$ being its wave number, $k_0=\omega\sqrt{\in_0\mu_0}$ is the wave number of vacuum, $\in_0$ and $\mu_0$ are permittivity and permeability of vacuum, respectively, $\overline{I}$ is the idem-factor, and $\overline{\overline{G}}_{m\in}=\nabla\times\overline{\overline{G}}_{e\in}$ is the magnetic field dyadic Green's function of non-magnetic homogeneous dielectric medium. The time convention $e^{i\omega t}$ is assumed and suppressed throughout the paper, t being time variable, and i=√−1. It's important to point out the following properties of the integral field representation (1):

a) The electric field inside the object volume V satisfies the same homogeneous wave equation $$\nabla\times\nabla\times E(r) - k_\in^2 E(r) = 0, r \in V - \partial V, \quad (3)$$

as the electric field dyadic $\overline{\overline{G}}_{e\in}$ $$\nabla\times\nabla\times\overline{\overline{G}}_{e\in} - k_\in^2 \overline{\overline{G}}_{e\in} = \overline{\overline{0}}, \quad (4)$$

and the magnetic field dyadic $\overline{\overline{G}}_{m\in}$ $$\nabla\times\nabla\times\overline{\overline{G}}_{m\in} - k_\in^2 \overline{\overline{G}}_{m\in} = \overline{\overline{0}}. \quad (5)$$

As such, (1) can be viewed as a superposition of the "electric type waves" $\overline{\overline{G}}_{ee}(r,r') \cdot J^e(r')$ at observation location r emanating from the source points r' situated on the surface of the scatterer $\partial V$ and weighed by the vector function $J^e$ at each location r'. Similarly, contributions into the field $\overline{\overline{G}}_{me}(r,r') \cdot J^m(r')$ can be interpreted as "magnetic type waves" at observation location r emanating from the source points r' situated on the surface of the scatterer $\partial V$ and weighed by the vector function $J^m$ at each surface location r'. It's important to point out here that the weighting functions $J^e$ and $J^m$ for the electric and magnetic type waves are defined by the true magnetic and electric fields on the surface of the scatterer. This is the natural consequence of the traditional equivalence principle field representation (1), which is derived from the second vector-dyadic Green's theorem (C. T. Tai, 1994)

$$\int_V \left[ \nabla \times \nabla \times E(r) \cdot \overline{\overline{G}}(r, r') - E(r) \cdot \nabla \times \nabla \times \overline{\overline{G}}(r, r') \right] dv + \qquad (6)$$
$$\oint_{\partial V} \left[ E(r) \times \nabla \times \overline{\overline{G}}(r, r') + (\nabla \times E(r)) \times \overline{\overline{G}}(r, r') \right] \cdot ds$$

The above operates on two independent fields defined in volume V and surface $\partial V$ bounding it. One of the fields is the true electric field E and the other is an auxiliary field $\overline{\overline{G}}$ (which is taken to be the electric field of a point source, i.e. the Green's function. Regardless of how the Green's function is defined, however, the consequence of obtaining the integral representation of the field (1) from the above Green's theorem, is that the true field E throughout the volume V is defined by the tangential component of the true field itself (equivalent electric current $J^e$) and of its curl (equivalent magnetic current $J^m$) on the surface $\partial V$ bounding the volume.

The novelty of the SSIE theory was partially in its demonstration of the fact that the field in a given volume does not necessarily have to be determined by itself and its derivatives defined on the surface bounding the volume as dictated by the classical Green's theorems. It rather can be expressed as the following superposition of the electric and magnetic type waves each satisfying the same wave equation as the true field but weighed with a single function J tangential to the surface bounding the volume as $$-i\omega\mu_0 \int_{\partial V} \overline{\overline{G}}_{ee}(r, r') \cdot aJ(r')ds' + \qquad (7)$$
$$\int_{\partial V} \overline{\overline{G}}_{me}(r, r') \cdot b\hat{n}(r') \times J(r')ds' = E(r),$$

where the observation point is inside the volume V excluding its boundary, i.e. $r \in V - \partial V$, and a and b are arbitrary constants.

The field both inside and outside a penetrable object can also be written as a integral over volume polarization current j based on volume equivalent principle (A. Peterson et al., 1998)

$$E(r) = E^{inc}(r) + \int_V \overline{\overline{G}}_{e0}(r, r') \cdot j(r')dv', r' \in V, r \in V_\infty \qquad (8)$$

where $j = k_0^2(\epsilon - 1)E$. We propose to constrain the internal single source field representation (7) with the volume equivalence principle (8) instead of the surface equivalence principle (1) as it was previously done in the traditional SSIEs. For that purpose we substitute (7) into (8) and enforce the latter for the tangential component of the electric field as we tend the observation point r to the boundary $\partial V$ from inside V, which produces the proposed Surface-Volume-Surface E-field SSIE $$-i\omega\mu_0 \hat{t} \cdot \oint_{\partial V} \overline{\overline{G}}_{ee}(r, r'') \cdot aJ(r'')ds'' + \qquad (9)$$
$$\hat{t} \cdot \oint_{\partial V} \overline{\overline{G}}_{me}(r, r'') \cdot b\hat{n}(r'') \times J(r'')ds'' -$$
$$k_0^2(\epsilon - 1)\hat{t} \cdot \int_V \overline{\overline{G}}_{e0}(r, r') \cdot \left( -i\omega\mu_0 \oint_{\partial V} \overline{\overline{G}}_{ee}(r', r'') \cdot aJ(r'')ds'' + \right.$$
$$\left. \oint_{\partial V} \overline{\overline{G}}_{me}(r', r'') \cdot b\hat{n}(r'') \times J(r'')ds'' \right)$$
$$dv' = \hat{t} \cdot E^{inc}(r), r \in \partial V,$$

where a and b are arbitrary constants. To simplify implementation in this work to determine the fictitious current J we consider a particular case of (9) in which constants a and b are taken to be 1 and 0, respectively. This yields proposed 3D-SVS-EFIE $$-i\omega\mu_0 \hat{t} \cdot \oint_{\partial V} \overline{\overline{G}}_\epsilon(r, r'') \cdot J(r'')ds'' + \qquad (10)$$
$$i\omega\mu_0 k_0^2(\epsilon - 1)\hat{t} \cdot \int_V \overline{\overline{G}}_0(r, r') \cdot \oint_{\partial V} \overline{\overline{G}}_\epsilon(r', r'') \cdot J(r'')ds'' dv' =$$
$$\hat{t} \cdot E^{inc}(r), r \in \partial V,$$

where $\hat{t}$ is the tangential vector to the surface $\partial V$. Note that since J is assumed to be tangential vector function defined on the surface $\partial V$, to balance the range and domain of the resulting operators, the V-EFIE has to be satisfied only for the tangential component of total electric field at the surface $\partial V$.

It is convenient to express the 3D-SVS-EFIE in the following operator form $$-\overline{T}_\epsilon^{\partial V, \partial V} \circ J + \overline{T}_0^{\partial V, V} \circ \overline{T}_\epsilon^{V, \partial V} \circ J = \hat{t} \cdot E^{inc}(r). \qquad (11)$$

In (11) each dyadic integral operators is a sum of two integral operators, one corresponding to the scalar potential contribution and one for the vector potential contribution. These operators are defined as follows:

$$\mathcal{T}_{\epsilon,\Phi}^{\partial V, \partial V} \circ J = \frac{i\omega\mu_0}{k_\epsilon^2} \oint_{\partial V} G_\epsilon(r, r'') \nabla_s'' \cdot J(r'')ds'', \qquad (12)$$

$$\mathcal{T}_{\epsilon,A}^{\partial V, \partial V} \circ J = i\omega\mu_0 \hat{t} \cdot \oint_{\partial V} G_\epsilon(r, r'')J(r'')ds'', \qquad (13)$$

$$\mathcal{T}_{\epsilon,\nabla\Phi}^{V, \partial V} \circ J = \frac{i\omega\mu_0}{k_\epsilon^2} \oint_{\partial V} \nabla' G_\epsilon(r', r'') \nabla_s'' \cdot J(r'')ds'', \qquad (14)$$

$$\mathcal{T}_{\epsilon,A}^{V, \partial V} \circ J = i\omega\mu_0 \oint_{\partial V} G_\epsilon(r', r'')J(r'')ds'', \qquad (15)$$

$$\mathcal{T}_{0,\varphi}^{\partial V, V} \circ j = \frac{1}{k_0^2} \int_V \nabla G_0(r, r') \cdot j(r')dv', \qquad (16)$$

$$\mathcal{T}_{0,a}^{\partial V, V} \circ j = \hat{t} \cdot \int_V G_0(r, r')j(r')dv', \qquad (17)$$

$$r \in \partial V, r' \in V.$$

Above, j is polarization current density, which is defined inside the scatterer as $j=k_0^2(\epsilon-1)E$ and $\nabla_s$ denotes surface divergence. With integral operator notions (12) to (17), the 3D-SVS-EFIE (11) is written as $$-(T_{\epsilon,\nabla\Phi}^{\partial V,\partial V}+T_{\epsilon,A}^{\partial V,\partial V})\circ J+(T_{0,\nabla\phi}^{\partial V,V}+T_{0,a}^{\partial V,V})\circ(T_{\epsilon,\nabla\Phi}^{V,\partial V}+T_{\epsilon,A}^{V,\partial V})\circ J=\hat{t}\cdot E^{inc}, \quad (18)$$

where $T_{\epsilon,\nabla\Phi}^{\partial V,\partial V}=\hat{t}\cdot\nabla T_{\epsilon,\Phi}^{\partial V,\partial V}$ and $T_{0,\nabla\phi}^{\partial V,V}=\hat{t}\cdot\nabla T_{0,\phi}^{\partial V,V}$.

Integral operators $(T_{\epsilon,\nabla\Phi}^{V,\partial V}+T_{\epsilon,A}^{V,\partial V})$ translate the unknown tangential weighting source function J from the boundary of the scatterer $\partial V$ to the total field inside the the scatterer V. Integral operators $(T_{0,\nabla\phi}^{\partial V,V}+T_{0,a}^{\partial V,V})$ map polarization current j inside of the scatterer V to the tangential scattered electric field on the boundary $\partial V$. Integral operators $(T_{\epsilon,\nabla\Phi}^{\partial V,\partial V}+T_{\epsilon,A}^{\partial V,\partial V})$ map tangential weighting sources J defined on the boundary of the scatterer $\partial V$ to the tangential component of the total electric field on the same boundary $\partial V$.

Method of Moments Discretization of 3D-SVS-EFIE Operators

In order to solve 3D-SVS-EFIE (10) with MoM, the volume of the scatterer V is discretized with a 3D mesh consisting of N tetrahedral elements. The surface of the scatterer $\partial V$ is discretized with 2D mesh consisting of M triangle elements. The number of elements N in the 3D mesh could be independent from the size of 2D mesh M. The meshes are depicted in FIG. 1. The position vector on the mth triangle element is defined parametrically as $r_m^{\partial v}(\xi,\eta)=r_{m(0)}^{\partial v}\xi+r_{m(1)}^{\partial v}\eta+r_{m(2)}^{\partial v}(1-\xi-\eta)$, where $r_{m(0)}^{\partial v}$, $r_{m(1)}^{\partial v}$, and $r_{m(2)}^{\partial v}$ are the position vectors of vertices of the mth triangle element on the boundary $\partial V$ and $\xi$ and $\eta$ are barycentric coordinates [1] $\xi\in[0,1]$, $\eta\in[0,1-\xi]$. Centroid of the mth triangle element is defined as $$c_m^{\partial v}=\frac{1}{3}(r_{m(0)}^{\partial v}+r_{m(1)}^{\partial v}+r_{m(2)}^{\partial v}).$$

The position vector on the n'th tetrahedron on the scatterer V is defined parametrically as $$r_{n'}^{v}(\xi',\eta',\zeta')=r_{n'(0)}^{v}\xi'+r_{n'(1)}^{v}\eta'+r_{n'(2)}^{v}\zeta'+r_{n'(3)}^{v}(1-\xi'-\eta'-\zeta')$$

where $r_{n'(0)}^{v}$, $r_{n'(1)}^{v}$, $r_{n'(2)}^{v}$ and $r_{n'(3)}^{v}$ are the position vectors of vertices of the n'th tetrahedron $\xi'$, $\eta'$, $\zeta'$ being the barycentric coordinates (J.-M. Fin, 2002) $\xi'\in[0,1]$, $\eta'\in[0,1-\xi']$, and $\zeta'\in[0,1-\xi'-\eta']$. Centroid of the n'th tetrahedron is defined as $$c_{n'}^{v}=\frac{1}{4}(r_{n'(0)}^{v}+r_{n'(1)}^{v}+r_{n'(2)}^{v}+r_{n'(3)}^{v}).$$

Discretization of the unknown tangential weighting function J defined on the boundary $\partial V$ is performed using a set of Rao-Wilton-Glisson (RWG) basis functions (A Peterson et al., 1998) defined on two adjacent triangle elements with common edge. For example m"th base function is positioned on the common edge m"th between two neighbour triangles $e_{m''}^{+}$ and $e_{m''}^{-}$ (FIG. 1) and is defined as $$t_{m''}(r'')=\begin{cases}\dfrac{r''-v_{m''}^{+}}{2A_{e_{m''}^{+}}}l_{m''}, & r''\in e_{m''}^{+},\\[6pt] \dfrac{v_{m''}^{-}-r''}{2A_{e_{m''}^{-}}}l_{m''}, & r''\in e_{m''}^{-},\end{cases} \quad (19)$$

where $l_{m''}$ is the length of the common edge between two triangles, $v_{m''}^{+}$ is non-common vertex in triangle $e_{m''}^{+}$ and $v_{m''}^{-}$ is non-common vertex in triangle $e_{m''}^{-}$ (FIG. 1) $A_{e_{m''}^{+}}$ and $A_{e_{m''}^{-}}$ are the areas of triangle $e_{m''}^{+}$ and $e_{m''}^{-}$, respectively. Thus MoM discretized form of the unknown tangential weighting function J is $$J(r'')\cong\sum_{m''=1}^{P}I_{m''}t_{m''}(r''), \quad (20)$$

where P is the total number of RWG basis functions. Since $\partial V$ is a closed surface, the number of edges P is exactly 1.5 times the number of triangles M, i.e. P=3/2M. The surface divergence of the RWG basis functions is two-pulse function defined on the adjacent elements as $$\nabla_s''\cdot t_{m''}(r'')=\begin{cases}\dfrac{l_{m''}}{A_{e_{m''}^{+}}}, & r''\in e_{m''}^{+},\\[6pt] -\dfrac{l_{m''}}{A_{e_{m''}^{-}}}, & r''\in e_{m''}^{-}.\end{cases} \quad (21)$$

as test functions we use the same set of RWG functions.

Discretization of each of the integral operators (12) to (17) with the above defined basis and testing functions is presented in the subsections below.

A. Discretizing of Scalar Potential Surface-to-Surface Operator $T_{\epsilon,\nabla\Phi}^{\partial V,\partial V}$ Matrix elements $Z_{\epsilon,\nabla\Phi mm''}^{\partial V,\partial V}$ in the MoM discretization of the operator $T_{\epsilon,\nabla\Phi}^{\partial V,\partial V}$ are produced by testing of the gradient of the scalar potential produced by $\nabla_s''\cdot t_{m''}$ with test function $t_m$, as follows:

$$Z_{\epsilon,\nabla\Phi mm''}^{\partial V,\partial V}=\langle t_m, T_{\epsilon,\nabla\Phi}^{\partial V,\partial V}\circ t_{m''}\rangle = \langle t_m, \nabla T_{\epsilon,\Phi}^{\partial V,\partial V}\circ t_{m''}\rangle. \quad (22)$$

Subsequently, the div-operator is shifted to the testing function $$Z_{\epsilon,\nabla\Phi mm''}^{\partial V,\partial V}=-\langle\nabla_s\cdot t_m, T_{\epsilon,\Phi}^{\partial V,\partial V}\circ t_{m''}\rangle= \quad (23)$$

$$-\frac{i\omega\mu_0}{k_\epsilon^2}\Bigg(\frac{l_m l_{m''}}{A_{e_m^+}A_{e_{m''}^+}}\int_{e_m^+}\int_{e_{m''}^+}G_\epsilon(r,r'')ds''ds -$$

$$\frac{l_m l_{m''}}{A_{e_m^+}A_{e_{m''}^-}}\int_{e_m^+}\int_{e_{m''}^-}G_\epsilon(r,r'')ds''ds -$$

$$\frac{l_m l_{m''}}{A_{e_m^-}A_{e_{m''}^+}}\int_{e_m^-}\int_{e_{m''}^+}G_\epsilon(r,r'')ds''ds +$$

$$\frac{l_m l_{m''}}{A_{e_m^-}A_{e_{m''}^-}}\int_{e_m^-}\int_{e_{m''}^-}G_\epsilon(r,r'')ds''ds\Bigg),$$

where m=1, ..., P and m"=1, ..., P, and $$\int_{e_m^i}\int_{e_{m''}^j}G_\epsilon(r,r'')ds''ds=4A_{e_m^i}A_{e_{m''}^j} \quad (24)$$

$$\int_0^1\int_0^{1-\xi}\int_0^1\int_0^{1-\xi''}G_\epsilon(r_m^{\partial v}(\xi,\eta),r_{m''}^{\partial v}(\xi'',\eta''))d\eta''d\xi''d\eta d\xi,$$

where i, and j could be + or −.

The surface integrals in (23) are computed using 2D quadrature rules. The 1/R-singularity is extracted from the Green's function $G_\in$, where R is $|r-r''|$. The 1/R-singular integrals are computed analytically in accord with what is described in D. R. Wilton et al., 1984.

B. Discretization of Vector Potential Surface-to-Surface Operator $T_{\in,A}^{\partial V,\partial V}$ The MoM discretization of the vector potential contribution to the tangential component of the total electric field E on the surface $\partial V$ produced by the unknown weighting function J is composed of four terms corresponding to the interactions between the two half-RWG test function segments with the two half-RWG segments of the basis function $$Z_{\in,A\ mm''}^{\partial V,\partial V} = \langle t_m, T_{\in,A}^{\partial V,\partial V} \circ t_{m''} \rangle = \quad (25)$$

$$i\omega\mu_0 l_m l_{m''} \times \left( \int_{e_m^+} \frac{r - v_m^+}{2A_{e_m^+}} \cdot \int_{e_{m''}^+} \frac{r'' - v_{m''}^+}{2A_{e_{m''}^+}} G_\in(r, r'') ds'' ds + \right.$$

$$\int_{e_m^+} \frac{r - v_m^+}{2A_{e_m^+}} \cdot \int_{e_{m''}^-} \frac{v_{m''}^- - r''}{2A_{e_{m''}^-}} G_\in(r, r'') ds'' ds +$$

$$\int_{e_m^-} \frac{v_m^- - r}{2A_{e_m^-}} \cdot \int_{e_{m''}^+} \frac{r'' - v_{m''}^+}{2A_{e_{m''}^+}} G_\in(r, r'') ds'' ds +$$

$$\left. \int_{e_m^-} \frac{v_m^- - r}{2A_{e_m^-}} \cdot \int_{e_{m''}^-} \frac{v_{m''}^- - r''}{2A_{e_{m''}^-}} G_\in(r, r'') ds'' ds \right),$$

where $m=1, \ldots, P$ and $m''=1, \ldots, P$. For example $$l_m l_{m''} \int_{e_m^+} \frac{r - v_m^+}{2A_{e_m^+}} \cdot \int_{e_{m''}^+} \frac{r'' - v_{m''}^+}{2A_{e_{m''}^+}} G_\in(r, r'') ds'' ds = \quad (26)$$

$$l_m l_{m''} \int_0^1 \int_0^{1-\xi} (r_m^{\partial v}(\xi,\eta) - v_m^+) \cdot \int_0^1 \int_0^{1-\xi''} (r_{m''}^{\partial v}(\xi'',\eta'') - v_{m''}^+)$$

$$G_\in(r_m^{\partial v}(\xi,\eta), r_{m''}^{\partial v}(\xi'',\eta'')) d\eta'' d\xi'' d\eta d\xi.$$

Each of the above four integrals requires singularity mitigation of $(r''-v_{m''}^+)/R$ for $e_m^+$ triangles and $(v_{m''}^- - r'')/R$ for $e_m^-$ triangles. The product of a linear function with 1/R-function is extracted from the Green's function $G_\in$, and integrated analytically over the element areas $e_m^+$ and $e_m^-$ (D. R. Wilton et al., 1984). The remaining non-singular integrals are computed directly using 2D quadrature rules.

C. Discretization of Scalar Potential Surface-to-Volume Operator $T_{\in,\nabla\Phi}^{V,\partial V}$ To discretize the contribution of the gradient of the scalar potential to the polarization current j from the surface divergence of the weighting function $\nabla_s \cdot J$ represented by the operator $T_{\in,\nabla\Phi}^{V,\partial V}$, we use volume pulse-functions on tetrahedron elements as testing functions $$p_{n'}(r') = \begin{cases} 1, & r' \in V_{n'}, \\ 0, & r' \notin V_{n'}, \end{cases} \quad (27)$$

where $n'=1, \ldots, N$ and RWG functions as the basis functions. This yields $$Z_{\in,\nabla\Phi n'm''}^{V,\partial V} = \langle p_{n'}, T_{\in,\nabla\Phi}^{V,\partial V} \circ t_{m''} \rangle = \frac{i\omega\mu_0}{k_\in^2 V(n')} \times \quad (28)$$

-continued $$\int_{V_{n'}} dv' \left( \frac{l_{m''}}{A_{e_{m''}^+}} \int_{e_{m''}^+} ds'' \nabla' G_\in(r',r'') - \frac{l_{m''}}{A_{e_{m''}^-}} \int_{e_{m''}^-} ds'' \nabla' G_\in(r',r'') \right),$$

where $V(n')$ is the volume of the n' tetrahedron, $n'=1, \ldots, N$ and $m''=1, \ldots, P$. To mitigate singularity in integrals of (28), we use gradient theorem (C. T. Tai, 1994)

$$\int_{V_{n'}} \nabla' G_\in(r',r'') dv' = \quad (29)$$

$$2 \sum_{i=0}^{3} A_{n',i}^e \hat{m}_{n',i} \int_0^1 \int_0^{1-\xi'} G_\in(r_{n',i}'(\xi',\eta'), r'') d\eta' d\xi'.$$

In (29), $\hat{m}_{n',i}$ is the normal vector to the ith face of the n'th tetrahedron, and $A_{n',i}^e$ is the area of the ith face of the n'th tetrahedron. The position vector $r'_{n',i}(\xi',\eta')$ is on the ith face of the n'th tetrahedron. The above operations produce definition of the matrix elements $Z_{\in,\nabla\Phi n'm''}^{V,\partial V}$ in the form featuring 1/-singular integrands. These integrals are computed using 2D Gauss-Legendre rule after extraction of the 1/R function. The integral of the latter on 2D triangles forming facets of the tetrahedrons is computed in closed form according to D. R. Wilton et al., 1984.

D. Discretization of Vector Potential Surface-to-Volume Operator $T_{\in,A}^{V,\partial V}$ The MoM discretization of the weighting function J contribution to the vector potential component of polarization current j determined by the operator $T_{\in,A}^{V,\partial V}$ involves inner products $$Z_{\in,An'm''}^{V,\partial V} = \langle p_{n'}, T_{\in,A}^{V,\partial V} \circ t_{m''} \rangle, \quad (30)$$

where scalar pulse-functions over tetrahedrons (27) are used as test functions and RWG functions are used as basis functions $$Z_{\in,An'm''}^{V,\partial V} = i\omega\mu_0 l_{m''} \int_{V_{n'}} dv' \left( \int_{e_{m''}^+} \frac{r'' - v_{m''}^+}{2A_{e_{m''}^+}} G_\in(r',r'') ds'' + \int_{e_{m''}^-} \frac{v_{m''}^- - r''}{2A_{e_{m''}^-}} G_\in(r',r'') ds'' \right), \quad (31)$$

where $n'=1, \ldots, N$ and $m''=1, \ldots, P$. The integral with the product of linear function and Green's function are computed similarly with the inner integrals over s'' in (25). Namely, the singular part of the integrands corresponding to the linear function product with 1/R-function is first extracted. Next, the remaining non-singular integrands are computed using 2D Gauss-Legendre quadrature rules.

E. Discretization of Scalar Potential Volume-to-Surface Operator $T_{0,\nabla\phi}^{\partial V,V}$ In order to match the discretized range of $T_{\in,\nabla\Phi}^{V,\partial V}$ operator with domain of $T_{0,\nabla\phi}^{\partial V,V}$ operator, which maps the polarization current inside the volume V of the scatterer to the tangential scattered electric field on the scatterer's boundary $\partial V$, we use scalar pulse basis functions to expand the polarization current density $j(r')$ in the volume V $$j(r') \cong \sum_{n'=1}^{N} i_{n'} p_{n'}(r') = \sum_{n'=1}^{N} (i_{n'}^x \hat{x} + i_{n'}^y \hat{y} + i_{n'}^z \hat{z}) p_{n'}(r'), \quad (32)$$

where $p_{n'}(r')$ is defined as $$p_{n'}(r') = \begin{cases} 1, & r' \in V_{n'}, \\ 0, & r' \notin V_{n'}, \end{cases} \quad (33)$$

where $V_{n'}$ being the region inside the n'th tetrahedron. The scattered field is tested with a set of vector RWG test functions $t_m$ similarly with the testing procedure for the operators $T_{\in,\nabla\Phi}^{\partial V, \partial V}$ and $T_{\in,A}^{\partial V, \partial V}$. Therefore, $$Z_{0,\nabla\varphi mn'}^{\partial V, V} = \langle t_m, T_{0,\nabla\varphi}^{\partial V, V} \circ p_{n'} \rangle. \quad (34)$$

To mitigate the singularity of the integrands the outer gradient operator is shifted to act onto the test function, yielding $$Z_{0,\nabla\varphi mn'}^{\partial V, V} = -\langle \nabla_s \cdot t_m, T_{0,\varphi}^{\partial V, V} \circ p_{n'} \rangle \quad (35)$$

$$= -\frac{l_m}{k_0^2} \left( \frac{1}{A_{e_m^+}} \int_{e_m^+} \int_{V_{n'}} \nabla G_0(r, r') dv' ds - \frac{1}{A_{e_m^-}} \int_{e_m^-} \int_{V_{n'}} \nabla G_0(r, r') dv' ds \right),$$

where m=1, ..., P and n'=1, ..., N. The singularity is further mitigated by using gradient theorem (Ct. T. Tai, 1994) which eliminates the inner gradient operator acting on the Green's function as follows:

$$\int_{V_{n'}} \nabla G_0(r, r') dv' = -\int_{V_{n'}} \nabla' G_0(r, r') dv' = \quad (36)$$

$$-2 \sum_{i=0}^{3} A_{n',i}^e \hat{m}_{n',i} \int_0^1 \int_0^{1-\xi'} G_0(r, r'_{n',i}(\xi', \eta')) d\eta' d\xi'.$$

In (36), $\hat{m}_{n',i}$ is normal vector to ith face of the n/thtetrahedron, and Ae is the area of ith face of the n'th tetrahedron. The position vector $r'_{n',i}(\eta', \xi')$ is on ith face of the n'th tetrahedron. The above operations produce definition of the matrix elements $Z_{0,\nabla\varphi mn'}^{\partial V, V}$ in the form of integrals featuring 1/R-singular integrands. These integrals are computed using 2D Gauss-Legendre rule after extraction of the $1/R$ function. The integral of the latter on 2D elements is computed in closed form according to D. T. Wilson et al., 1984.

F. Discretization of Vector Potential Volume-to-Surface Operator $T_{0,a}^{\partial V, V}$ The operator $T_{0,a}^{\partial V, V}$ maps volume polarization current j onto the vector potential contribution to the scattered electric field. Its MoM discretization is done with pulse basis functions (27) on the tetrahedral elements of the volume V expanding the volume current j and the vector RWG test functions (19) testing the vector potential $$Z_{0,amn'}^{\partial V, V} = \langle t_m, T_{0,a}^{\partial V, V} \circ p_{n'} \rangle$$

$$= \int_{e_m^+} \frac{r - v_n^+}{2 A_{e_m^+}} l_m \cdot \int_{V_{n'}} G_0(r, r') dv' ds +$$

$$\int_{e_m^-} \frac{v_m^- - r}{2 A_{e_m^-}} l_m \cdot \int_{V_{n'}} G_0(r, r') dv' ds,$$

where m=1, ..., P and n'=1, ..., N. The 3D integral on the tetrahedron is defined as $$\int_{V_{n'}} G_0(r, r') dv' = \quad (38)$$

$$6 V(n') \int_0^1 \int_0^{1-\xi'} \int_0^{1-\xi'-\eta'} G_0(r, r_{n'}^v(\xi', \eta', \zeta')) d\xi' d\eta' d\zeta',$$

where V(n') is the volume of the $n^r$ tetrahedron. The 3D integrals over $\xi'$, $\eta'$ and $\zeta'$ in (38) are evaluated using 3D quadrature rules after 1/R-singular part is subtracted from the Green's function $G_0$ and integrated analytically according to D. T. Wilton et al., 1984. The test integrals over triangle elements are computed using 2D Gauss-Legendre quadrature rules.

G. Discretization of Incident Field $E^{inc}$

The discretization of the incident field is done through the definition of the inner products of the incident field with the RWG test functions (19)

$$V_m = \langle t_m, E^{inc} \rangle = l_m \left( \int_{e_m^+} \frac{r - v_m^+}{2 A_{e_m^+}} \cdot E^{inc}(r) ds + \int_{e_m^-} \frac{v_m^- - r}{2 A_{e_m^-}} \cdot E^{inc}(r) ds \right), \quad (39)$$

where m=1, ..., P. The integrals in (39) are regular and computed to desired precision using 2D Gauss-Legendre quadrature rules.

H. MoM Matrix Assembly

Figure 2:
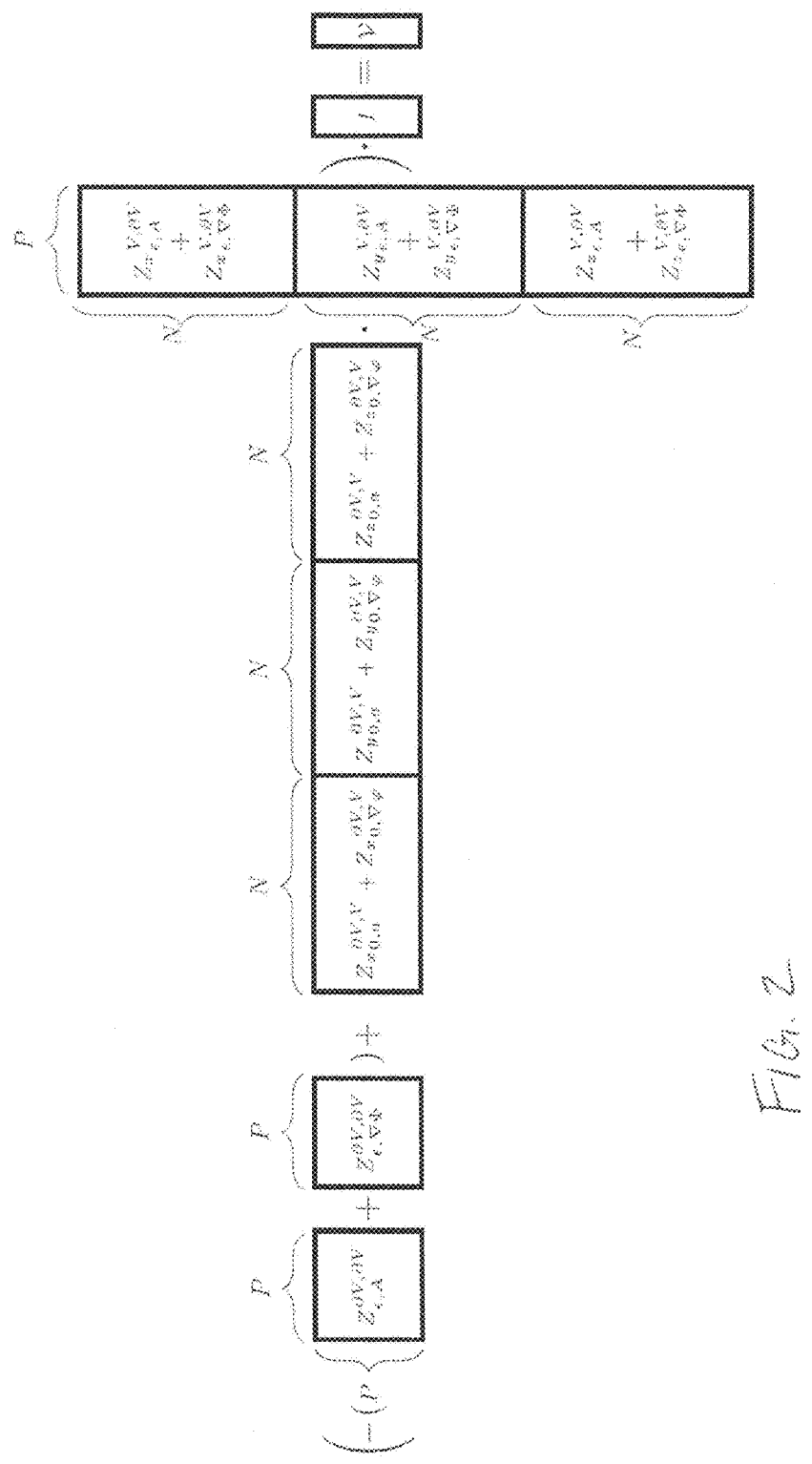
FIG. 2 illustrates a structure of the system of linear algebraic equations resulting from MoM discretization of the 3D-SVS-EFIE. The number of RWG basis functions on the boundary of ∂V is P and N is the number of tetrahedral cells in volume V.

The MoM discretization of the 3D-SVS-EFIE reduces is to the following set of linear algebraic equations with respect to the (P×1) vector of unknown scalar coefficients I in the expansion of the unknown surface weighting function (20)

$$-([Z_{\in,A}^{\partial V, \partial V}] + [Z_{\in,\nabla\Phi}^{\partial V, \partial V}]) \cdot [I] + (([Z_{0,a}^{\partial V, V}] + [Z_{0,\nabla\varphi}^{\partial V, V}]) \odot \Gamma^{-1} ([Z_{\in,A}^{V, \partial V}] + [Z_{\in,\nabla\Phi}^{V, \partial V}])) \cdot [I] = [V] \quad (40)$$

where $\odot$ is dot product of two matrices composed of vector quantities and $\Gamma$ Gram matrices. Each element of Gram matrix $\Gamma$ is defined as $$\Gamma_{n_o, n_s} = \begin{cases} \int_0^1 \int_0^{1-\xi'} \int_0^{1-\xi'-\eta'} j_t(n_o) d\xi' d\eta' d\zeta', & \text{if } n_o = n_s, \\ 0, & \text{otherwise,} \end{cases} \quad (41)$$

where $n_o$, $n_s$=1, ..., N and $j_t(n_o)$ is Jacobian of $n_o$th tetrahedron. In the expanded form the structure of the MoM matrix equation is given by the following expression and is depicted in FIG. 2

$$-([Z^{\partial V,\partial V}_{\in,A}] + [Z^{\partial V,\partial V}_{\in,\nabla\varphi}]) \cdot [I] + \qquad (42)$$

$$\sum_{d=\{x,y,z\}} (([Z^{\partial V,V}_{d_0,a}] + [Z^{\partial V,V}_{d_0,\nabla\varphi}])\Gamma^{-1} \cdot ([Z^{V,\partial V}_{d_\in,A}] + [Z^{V,\partial V}_{d_\in,\nabla\varphi}])) \cdot [I] = [V],$$

The above system of linear algebraic equations with P unknowns can be written in the compact form as $[Z]\cdot[I]=[V]$ with respect to the unknown coefficients $I_1, \ldots, I_P$ in the expansion (20) of the sought weighting function J.

I. Computation of Electric Field Inside the Scatterer

After solving the system of linear algebraic equations (42) for the expansion coefficients [I] in the expansion of weighting function J on $\partial V$ the electric field E and volume polarization current j in the scatterer volume V can be computed as a superposition of the waves emanating from the surface $\partial V$ according to (32). The MoM matrices $Z_{\in,A}^{V,\partial V}$ and $Z_{\in,\nabla\Phi}^{V,\partial V}$ can be used to compute the electric field E at the centres of the tetrahedral elements in the volume of the scatterer $c_n^v$ can be calculated as $$[E(c_{n'}^v)] = -\Gamma^{-1}([Z_{\in,A}^{V,\partial V}] + [Z_{\in,\nabla\Phi}^{V,\partial V}]) \cdot [I], \qquad (43)$$

$n'=1, \ldots, N$, and $c_{n'}^v$ are the centres of the tetrahedral elements in the volume of the scatterer.

J. Validating the Representation of the Total Electric Field Inside the Scatterer (8)

To validate (8), we consider the case of the relative permittivity ε equal to 1. In this case, the proposed 3D-SVS-EFIE (10) is simplified to $$-i\omega\mu_0 \hat{t} \cdot \int_{\partial V} \overline{\overline{G}}_\epsilon(r, r'') \cdot J(r'')dr'' = \hat{t} \cdot E^{inc}(r), \ r \in \partial V. \qquad (44)$$

and the developed MoM solution (42) is simplified to $$-([Z_{\in,A}^{\partial V,\partial V}] + [Z_{\in,\nabla\Phi}^{\partial V,\partial V}]) \cdot [I] = [V]. \qquad (45)$$

Solving this system of linear algebraic equation results to a solution which if we plug it back to (43) we could obtain the incident field vector at center of each tetrahedron inside the scatterer.

K. Computation of Electric Field Outside the Scatterer

The total electric field outside the scatterer is computed as $E(r)=E^{inc}(r)+E^{scat}(r)$, where scattered field is defined by the polarization current in the volume of the scatterer as $$E^{scat}(r) = k_0^2(\epsilon - 1) \int_V \overline{\overline{G}}_0(r, r') \cdot E(r')dv'. \qquad (46)$$

With the discretized total electric field $E(c_{n'}^v)$ available available at the centres of tetrahedral elements $c_{n'}^v$ in the volume of the scatterer V from (43), we compute the scattered field outside V as $$E^{scat}(r) = k_0^2(\epsilon - 1) \sum_{n'=1}^N E(c_{n'}^v) \int_{V_{n'}} G_0(r, r'_{V_{n'}})dv' - \qquad (47)$$

$$(\epsilon - 1) \sum_{n'=1}^N E(c_{n'}^v) \nabla \int_{V_{n'}} \nabla' G_0(r, r'_{V_{n'}})dv'.$$

The first term in (47) corresponding to the vector potential contribution into the total electric field is computed using 3D Gauss quadrature rule after the 1/R singularity is extracted from the Green's function G0 and the integral $$\int_{V_{n'}} \frac{1}{|r-r'|}dv'$$

over the volume of each tetrahedron is computed analytically according to D. T. Wilton et al., 1984.

The contribution of the gradient of the scalar potential into the total field from each tetrahedron is first reduced to four surface integrals from 1/R part of the Green's function over the faces of the tetrahedron, each of which can be evaluated analytically. Subsequently, the derivatives associated with the gradient operator of the analytic integral of 1/R function over each face of the tetrahedron, i.e.

$$\nabla \int_{\partial V_{n'}} \frac{1}{|r-r'|}ds',$$

can be also evaluated analytically. Extraction of the singular integrals $$\nabla \int_{\partial V_{n'}} \frac{1}{|r-r'|}ds'$$

from the second term in (47) allows for use of regular 2D quadrature rules on the remaining non-singular integrands defined on each of the four tetrahedron's faces.

Numerical Results

To validate the proposed new SSIE we conducted various numerical experiments and compared solutions of the scattering problems obtained using the new 3D-SVS-EFIE equation and alternative methods such as analytic Mie series field expansions.

Figure 3:
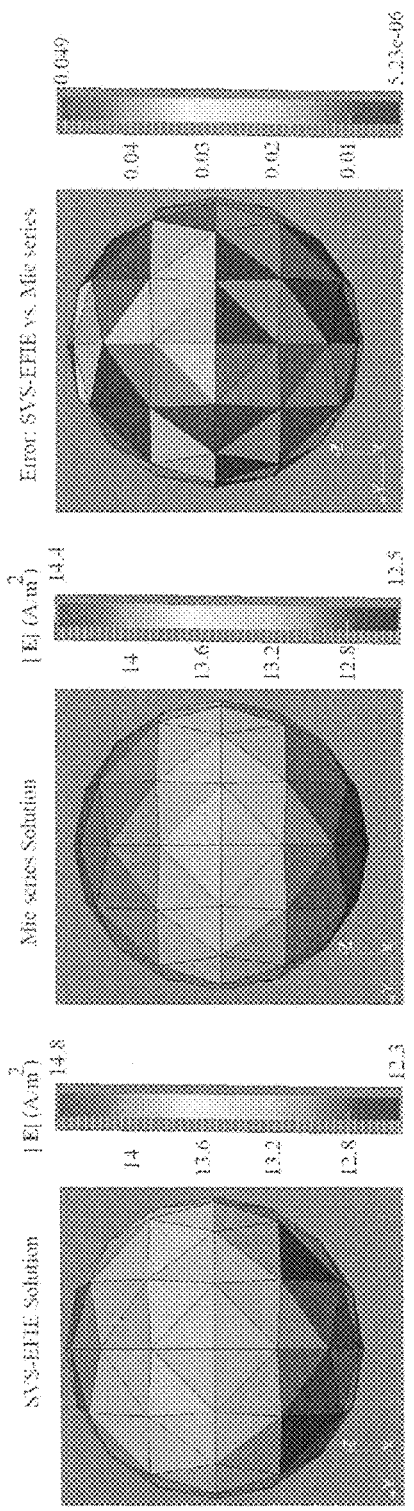
FIG. 3 illustrates distribution of magnitude of total electric field at 300 MHz inside a sphere of permittivity ε=2 and radius 0.1 m centered at the origin produced by z-directed electric dipole situated at location x=0 m, y=0 m, and z=2 m. The electric dipole moment Il=1[A·m]. The number of triangles in MoM discretization (indicated at equation 41) of 3D-SVS-EFIE (indicated at equation 10) on the boundary of ∂V is M=128, number of edges is P=192 and number of tetrahedrons in the volume V is N=185. Total electric field of the dielectric sphere obtained from 3D-SVS-EFIE (left plot) and Mie series (center plot). The relative error distribution (right plot) of these two solutions with respect to Mie series solution.

In the first example, we consider the problem of radial dipole excitation on a dielectric sphere with radius of R=0.1m and dielectric permittivity $\epsilon_r=2$. The sphere is excited by an electric dipole, which is directed along the positive and situated above the north pole of the sphere 2m away from the origin. The electric dipole moment Il=1 [A·m]. The numerical solution of the scattering problem obtained at 300 MHz using the proposed new 3D-SVS-EFIE (10) is shown in FIG. 3. For comparison in the same FIG. 3 the solution obtained using analytic Mie series expansion is shown also as well as the relative error between the two solutions. The MoM discretization of the 3D-SVS-EFIE involved M=128 triangle elements discretizing the boundary $\partial V$ of the sphere, 192 RWG basis functions (P=192), and 185 tetrahedral elements discretizing its volume V (N=185). The field inside the sphere is computed using superposition expression (8) after the weighting function J expansion coefficients [I] in (20) were obtained from solution of the system of linear algebraic equations (SLAE) (42). Upon availability of the field distribution in the volume of the sphere the scattered field outside the sphere can be computed using expression (47) and added to the incident field. The MoM solution of the 3D-SVS-EFIE is seen to match closely with the analytic Mie series solution in accord with the error levels expected from the used discretization density. The average error of the 3D-SVS-EFIE solution is 0.01 with standard deviation $9.81 \cdot 10^{-3}$. The discretization corresponds to the sampling of the electric field inside the sphere with approximately 30 elements per wavelength.

Figure 4:
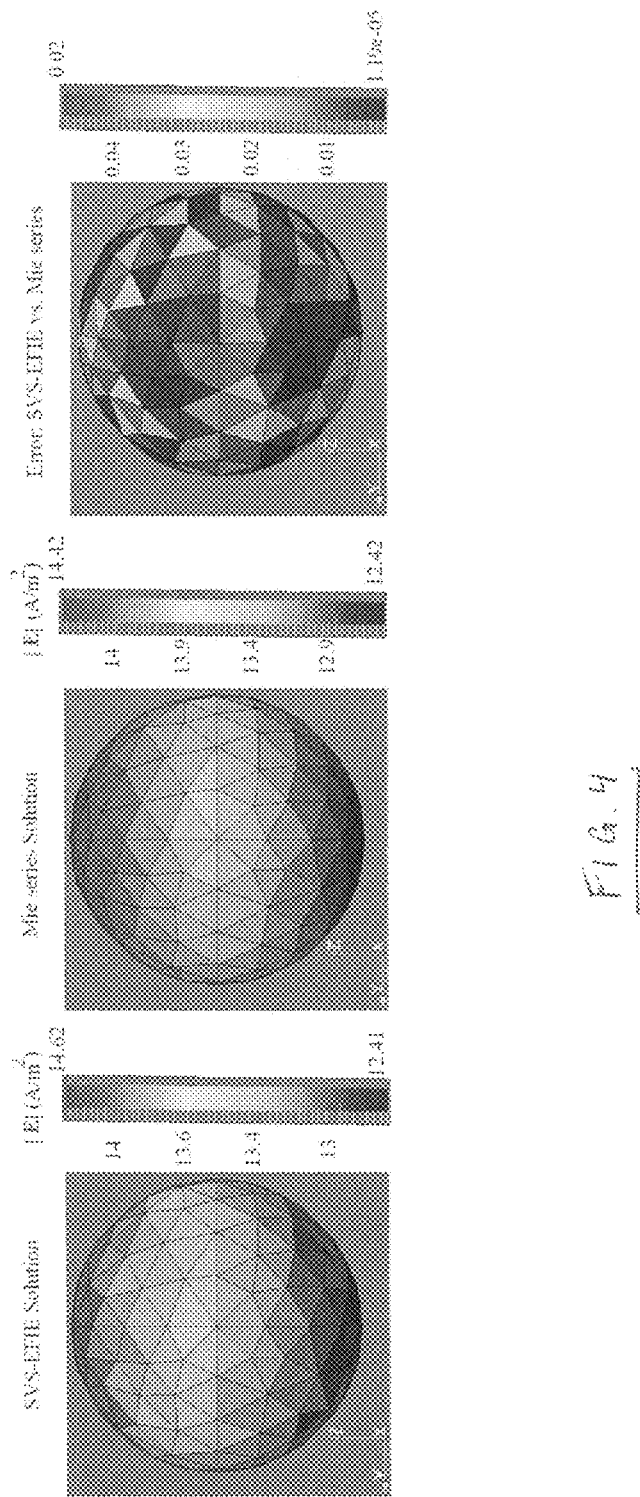
FIG. 4 illustrates distribution of magnitude of total electric field at 300 MHz inside a sphere of permittivity ε=2 and radius 0.1 m centered at the origin produced by z-directed electric dipole situated at location x=0 m, y=0 m, and z=2 m. The electric dipole moment Il=1[A·m]. The number of triangles in MoM discretization (equation 41) of 3D-SVS-EFIE (equation 10) on the boundary ∂V is M=340, number of edges is P=510 and number of tetrahedrons in the volume V is N=753. Total electric field of the dielectric sphere obtained from 3D-SVS-EFIE (left plot) and Mie series (center plot). The relative error distribution (right plot) of these two solutions with respect to Mie series solution.
Figure 5:
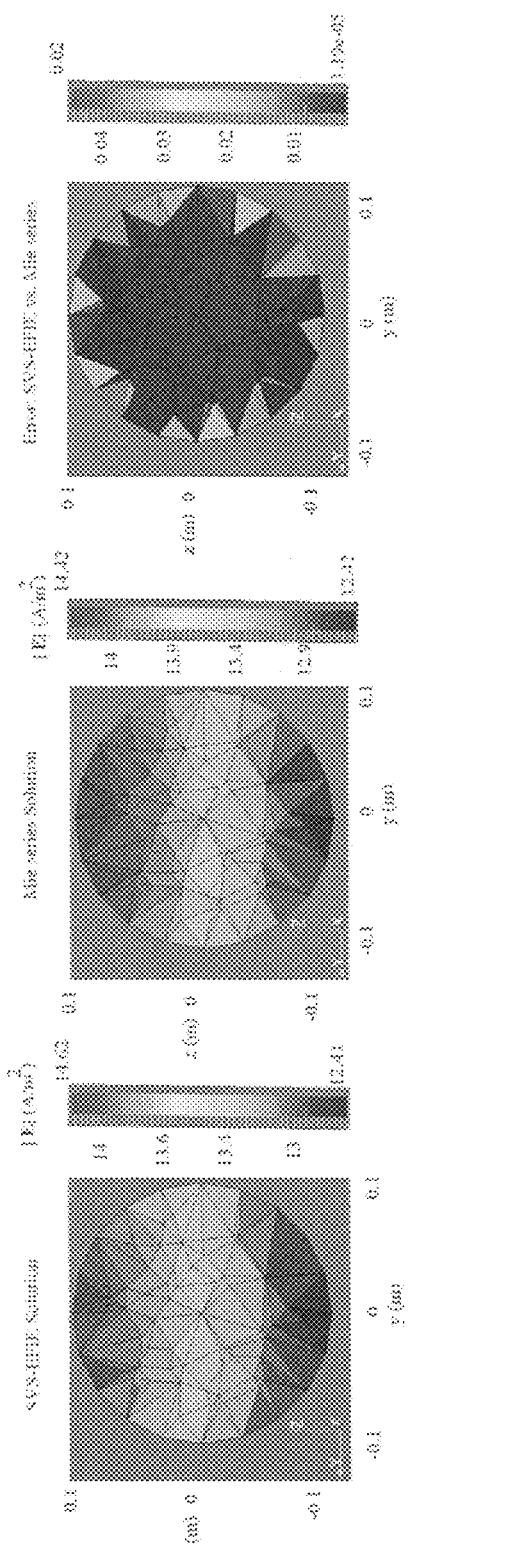
FIG. 5 illustrates distribution of magnitude of total electric field at 300 MHz inside a slice of the sphere along the x-axis. The sphere has permittivity ε=2 and radius 0.1 m centered at the origin produced by z-directed electric dipole situated at location x=0 m, y=0 m, and z=2 m. The electric dipole moment Il=1[A·m]. The number of triangles in MoM discretization (equation 41) of 3D-SVS-EFIE (equation 10) on the boundary ∂V is M=340 which forms P=510 RWG basis functions. The number of tetrahedrons in the volume V is N=753. Total electric field of the dielectric obtained from 3D-SVS-EFIE is in the left plot and Mie series is in the center plot. The relative error distribution of these two solutions with respect to Mie series solution is shown in the right plot.

In order to demonstrate the behavior of error in the MoM solution of the proposed 3D-SVS-EFIE, we next consider the same scattering problem on the sphere dielectric but discretized with N=753 tetrahedral elements in the volume V and M=340 triangle elements on the boundary ∂V. The number of RWG basis functions for this case is P=510. The discretization corresponds to the sampling of the electric field inside the sphere with approximately 50 elements per wavelength. The numerical solution of the scattering problem obtained using the proposed new 3D-SVS-EFIE (10) is shown in FIG. 4. For comparison in the same FIG. 4 the solution obtained using analytic Mie series expansion is shown also as well as the relative error between the two solutions. The relative error of the 3D-SVS-EFIE solution compared to the exact Mie series solution shows that the average relative error of the 3D-SVS-EFIE solution decreases below 0.0036 with standard deviation of $4.6 \cdot 10^{-3}$. Increased accuracy in the computed field observed with the increased MoM sampling rate per wavelength corroborates the rigorous nature of the proposed new SSIE.

Figure 6:
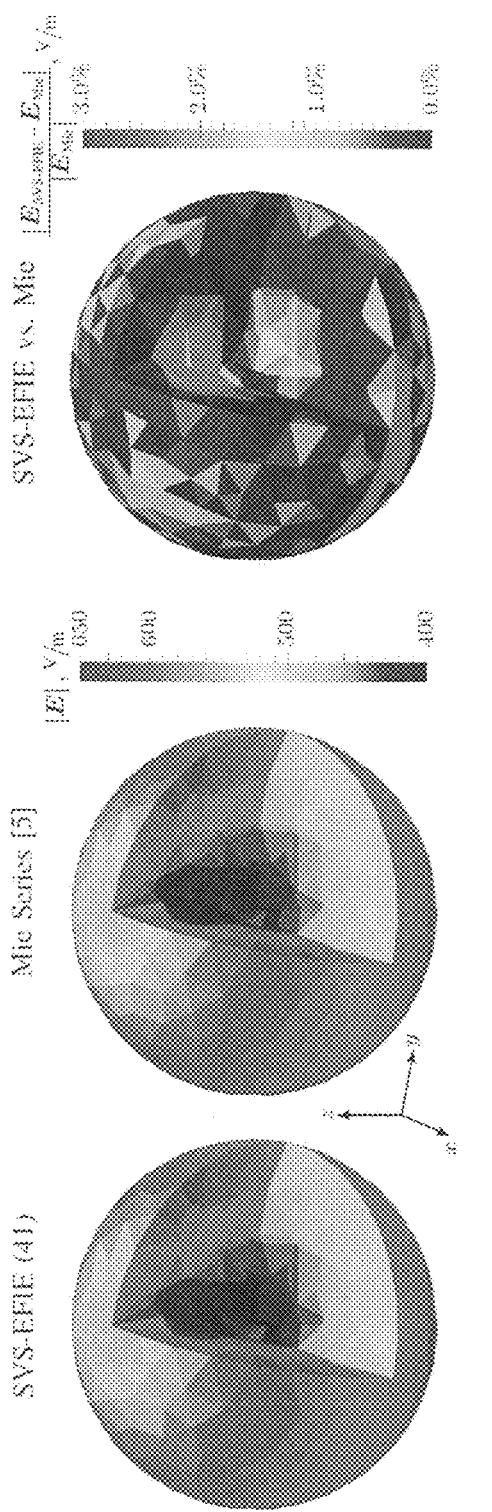
FIG. 6 illustrates distribution of the magnitude of total electric field at 1.5 GHz in a dielectric sphere (concave cut is made for improved visibility) with permittivity ε=1.5 and radius 0.1 m centered at the origin produced by z-directed electric dipole situated at location {0,0,0.4} m. The electric dipole moment is Il=1[A·m]. The number of triangles in MoM discretization (equation 41) of 3D-SVS-EFIE (equation 10) on the boundary ∂V is M=766, number of edges is P=1149 and number of tetrahedrons in the volume V is N=2546. Total electric field of the dielectric obtained from 3D-SVS-EFIE is in the left plot and Mie series is in the center plot. The relative error distribution of these two solutions with respect to Mie series solution is shown in the right plot.

To demonstrate solution of the proposed 3D-SVS-EFIE (10) in full-wave regime we consider the problem of radial dipole radiation near dielectric sphere at 1.5 GHz. In the example, dielectric sphere with radius of R=0.1 m and dielectric permittivity $\in_r$=1.5 is excited by an electric dipole, which is directed along the positive z-axis and situated 0.4 m away from the origin above the north pole of the sphere. The electric dipole moment Il=1[A·m]. The number of triangles in MoM discretization (41) of 3D-SVS-EFIE (10) on the boundary ∂V is M=766 including P=1149 RWG basis functions, and number of tetrahedrons in the volume V is N=2546. This discretization corresponds to approximately 10 elements per wavelength sampling rate. The results of these full-wave field computations are depicted in FIG. 6.

Figure 7:
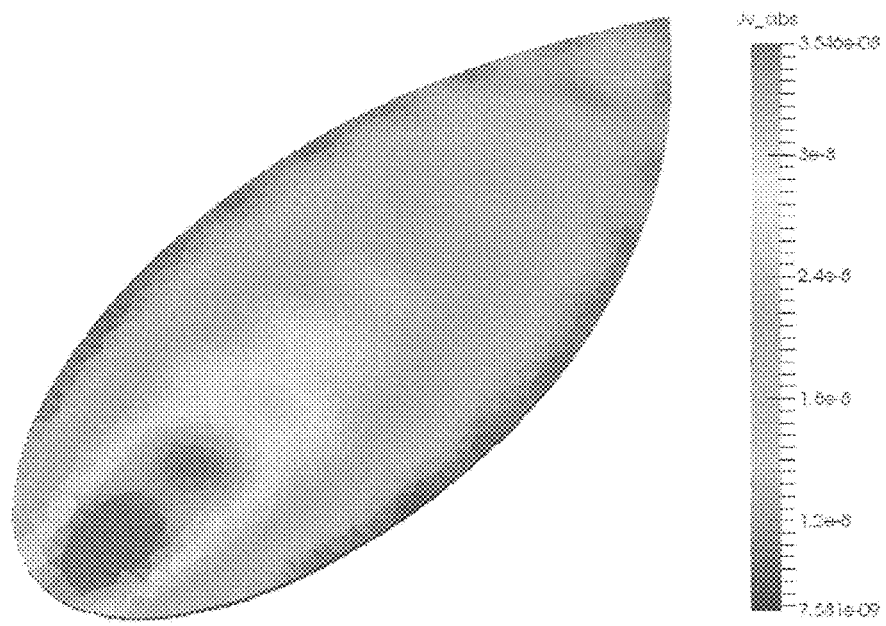
FIG. 7 illustrates distribution of the magnitude of total electric field at 6 GHz in the cross-section of a dielectric NASA Almond model with permittivity ε=1.5 and size of 0.252 m, 0.0976 m, and 0.0325 m along x, y, z axes, respectively. The model is excited by electric dipole directed along short axis of the dipole and situated on the long axis of the almond 0.8528 m away for from its tip. The electric dipole moment is Il=1[A·m]. The number of triangles in MoM discretization (equation 41) of 3D-SVS-EFIE (equation 10) on the boundary ∂V is M=11,994, number of edges is P=17,991 and number of tetrahedrons in the volume V is N=61,617.
Figure 8:
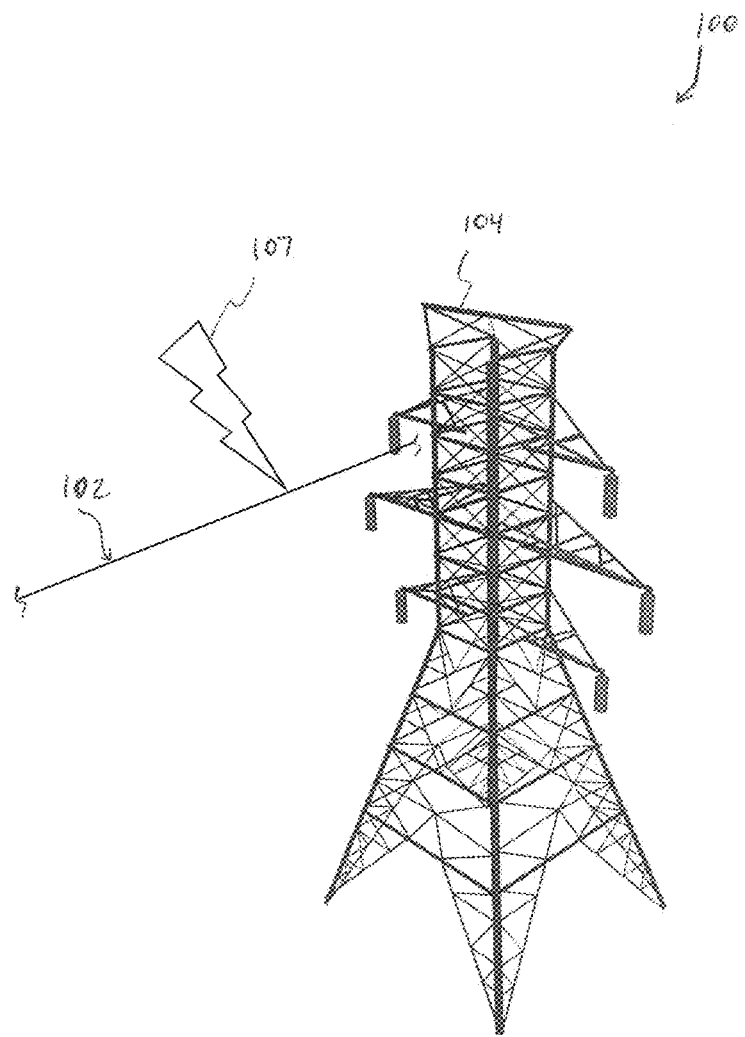
FIG. 8 illustrates a power system according to one application of calculating electric field with the 3D-SVS-EFIE.
Figure 9:
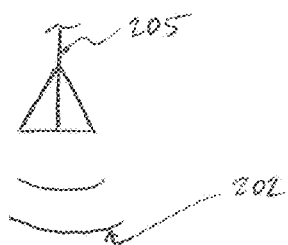
FIG. 9 illustrates remote sensing of a stratified structure according to another application of calculating electric field with the 3D-SVS-EFIE.
Figure 9:
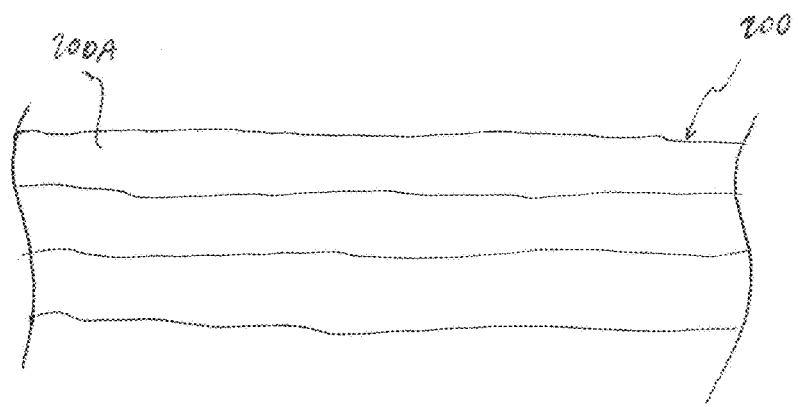

Demonstration of the 3D-SVS-EFIE performance for analysis of a general 3D target NASA almond model is considered at 6 GHz. The target has permittivity ∈=1.5 and size of 0.252 m, 0.0976 m, and 0.0325 m along x, y, and z axes, respectively. The model is excited by electric dipole directed along short axis of the dipole and situated on the long axis of the almond 0.8528 m away for from its tip. The electric dipole moment is Il=1 A·m. The number of triangles in MoM discretization (41) of 3D-SVS-EFIE (10) on the boundary ∂V is M=11,994, number of edges is P=17,991 and number of tetrahedrons in the volume V is N=61,617. Distribution of the computed field is depicted in FIG. 7.

CONCLUSIONS

The paper presented a new single-source surface-volume-surface integral equation with its solution for 3D scattering problem on homogeneous non-magnetic penetrable dielectrics. The new equation is derived from the classical volume electric field integral equation via representation of the electric field inside the scatterer as a superposition of the spherical waves emanating from its boundary.

Detailed description of Method of Moment (MoM) discretization for the new single source integral equation (SSIE) is provided. The proposed MoM scheme is new compared to the previously known MoM discretizations of the traditional surface integral equations as well as the previously known SSIEs. The MoM basis and testing functions are chosen in such a way that with appropriate shift of the differential operators only 1/R singular kernels are featured in the definitions of the MoM inner products.

With the proposed new SSIE determining the sought fields is a two-stage process. In the first stage the unknown weighting function on the boundary of the scatterer is determined. This function is subsequently used to obtain the field distribution inside the scatterer. In the second stage the total field outside the scatterer is computed using the volume equivalence principle. The novel equation features only a single unknown on the boundary and is numerically shown to produce an error-controllable solution.

APPLICATIONS

In one application of the 3D-SVS-EFIE an electrical disturbance within a power system 100 is evaluated. The power system includes a power conductor such as a transmission cable 102 supported by a supporting infrastructure such as a transmission tower 104 delivering electrical power from one location to another. During a weather event such as a lightning storm, lighting 107 (schematically illustrated) may strike the transmission cable 102 causing current to be injected into the power system. The 3D-SVS-EFIE is used to calculate the electric field in response to a simulated lighting strike, including the field emitted by the supporting infrastructure 104, at a desired, location within the power system and based thereon a charge distribution in the power system can be determined. Any faults in the power system thus may be located by analyzing the charge distribution in the power system. Upon location of a fault the power system may be modified in a conventional, known manner to correct therefor.

Another application of the 3D-SVS-EFIE includes remote sensing a layered or stratified structure 200. Typically, this is done using a radar wave 202 (schematically shown) emanating from a satellite antenna 205 and propagating through the stratified structure so as to measure or determine configuration of the stratified structure, for example thickness of its layers 200A and permittivities. In one example of such a remote sensing application, the stratified structure is ice having a plurality of ice layers as is typical in arctic regions. The suitable antenna 205 sends waves 202 to the ice from a distance. The 3D-SVS-EFIE is used in calculation of the electric field at a reference location above the stratified structure whereat there is provided suitable measuring equipment for measuring electric field, the calculated electric field including incident waves from the antenna 205 and contribution from the field which is emitted by reflection from the stratified structure, and using the calculated field a configuration of the layers of the stratified structure can be identified.

Figure 10:
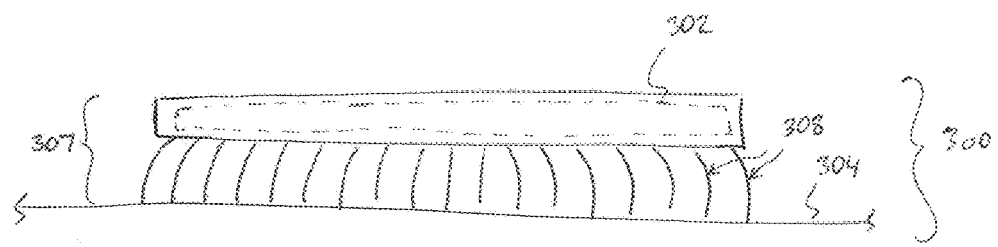
FIG. 10 illustrates a circuit according to a further application of calculating electric field with the 3D-SVS-EFIE.

In a further application of the 3D-SVS-EFIE it is implemented in design of a circuit 300 which comprises a processor chip 302 communicating with a circuit board 304 using an electronic package 307 of conductive wires 308. In FIG. 10, the processor chip 302 is shown in broken line inside the package 307. Cross-talk between wires in close proximity is a known and understood problem in this field that affects performance of the circuit 30. Thus, the 3D-SVS-EFIE can be used to calculate the electric field at a desired location within the circuit 300, including the electric field(s) emitted by the neighbouring conductive wires 308 of the package, and using the calculated field communication rate limitations in the circuit can be identified. Having identified these limitations the designer may then modify the configuration of the circuit so as to improve circuit performance. Modification may include re-routing the conductive wires of the package, and/or providing electromagnetic shielding between some of the conductive wires so as to minimize cross-talk.

A new single-source integral equation is proposed for solution of electromagnetic wave scattering problems. The traditional volume electric field integral equation is reduced to the new single-source surface integral equation by representing the electric field inside the scatterer as a superposition of spherical waves emanating from its boundary. This new single source surface integral equation has several advantages. While being rigorous in nature, it features half of the degrees of freedom compared to traditional surface integral equation formulations. It is also substantially simpler in both formulation and from the numerical solution point of view compared to the previously known single source integral equations. It features only electric-field-type of Green's function instead of both electric and magnetic field Green's functions. The latter is a useful property when scattering in layered media is analyzed. Such new integral equation formulation have been previously developed for the case of 2D scattering problems. In this disclosure is described a 3D form of this new single-source surface integral equation for homogeneous dielectrics. The method of moments discretization and the resultant matrices for the proposed equation are presented. In order to validate the new integral equation formulation and verify the accuracy of its method of moments discretization, its solution is compared against the Mie series exact analytical solution and fields computed using commercial electromagnetic software.

Since various modifications can be made in my invention as herein above described, and many apparently widely different embodiments of same made, it is intended that all matter contained in the accompanying specification shall be interpreted as illustrative only and not in a limiting sense.

REFERENCES

A. Kishk and L. Shafai, "Different formulations for numerical solution of single or multibodies of revolution with mixed boundary conditions," IEEE Trans. Antennas Propagation, vol. 34, no. 5, pp. 666-673, May 1986.

A. Menshov and V. Okhmatovski, "New single-source surface integral equations for scattering on penetrable cylinders and current flow modeling in 2-D conductors," IEEE Trans. Microw. Theory Techn., Vol. 61, no. 1, pp. 341-350, January 2013.

A. Peterson, S. Ray, and R. Mittra, *Computational Methods for Electromagnetics*, IEEE Press, 1998.

A. Taflove and S. C. Hagness, *The Finite-Difference Time-Domain Method*, 3rd ed. Norwood: Artech House, 2005.

A. W. Glisson, "An integral equation for electromagnetic scattering from homogeneous dielectric bodies," IEEE Transactions on Antennas and Propagation, vol. AP-32, no. 2, pp. 173-175, 1984.

C. T. Tai, *Dyadic Green Functions in Electromagnetic Theory*, 2nd ed. New York: IEEE Press, 1994.

D. Maystre and P. Vincent, "Diffraction d'une onde electromagnetique plane par un object cylindrique non inniniment conducteur de section arbitraire," Optics Commun., vol. 5, pp. 327-330, 1972.

D. Swatek, "Investigation of single source surface integral equation for electromagnetic wave scattering by dielectric bodies," Ph.D. Thesis, Univ. of Manitoba, Canada, 1999. [Online]. Available: http://hdl.handle.net/1993/1699

D. R. Wilton, S. M. Rao, A. W. Glisson, D. H. Schaubert, O. M. Albundak and C. M. Butler, "Potential Integrals for Uniform and Linear Source Distributions on Polygonal and Polyhedral Domains," IEEE Trans. Antennas Propagation, vol. AP-32, no. 3, pp. 409-418, March 1984.

F. L. S. Hosseini, A. Menshov, and V. Okhmatovski, "New vector singlesource surface integral equation for scattering problems on dielectric objects in 2D," IEEE Trans. Antennas Propagation, April 2016 (submitted).

F. Valdes, F. P. Andriulli, H. Bagci, and E. Michielssen, On the discretization of single source integral equations for analyzing scattering from homogeneous penetrable objects, IEEE Antennas and Propagation Soc. Int. Symp., pp. 14, July 2008.

J. Zhao and W. C. Chew, "Integral equation solution of Maxwells equations from zero frequency to microwave frequencies," IEEE Trans. Antennas Propagation, vol. 48, no. 10, pp. 16351645, October 2000.

J.-M. Jin, *The Finite Element Method in Electromagnetics*, 2nd ed. New York: Wiley, 2002.

J. Markkanen and C. C. Lu and X. Cao and P. Yla-Oijala, "Analysis of Volume Integral Equation Formulations for Scattering by High-Contrast Penetrable Objects," IEEE Trans. Antennas and Propagation, vol. 60, no. 5, pp. 2367-2374, May. 2012.

K. Cools, F. P. Andriulli, and E. Michielssen, "A Calderon multiplicative preconditioner for the PMCHWT integral equation," IEEE Trans. Antennas Propagation, vol. 59, no. 12, pp. 45794587, December 2011.

K. A. Michalski and D. Zheng, "Electromagnetic Scattering and Radiation by Surfaces of Arbitrary Shape in Layered Media, Part I: Theory," IEEE Trans. Antennas Propagation, vol. 38, no. 3, pp. 335-344, March 1990.

M. Taskinen, P. Yla-Oijala "Current and charge Integral equation formulation," IEEE Trans. on Antennas and Propagation, vol. 54, pp. 5867, January 2006.

P. Yl-Oijala and M. Taskinen, "Application of combined field integral equation for electromagnetic scattering by dielectric and composite objects," IEEE Trans. Antennas Propagation, vol. 53, no. 3, pp. 11681173, March 2005.

R. Harrington, *Field Computation by Moment Methods*, IEEE Press, 1993.

V. Okhmatovski, A. Menshov, F. L. S. Hosseini, S. Zheng, "Novel single-source integral equation in electromagnetics," URSI Intl. Symp. Electromagnetic Theory (EMTS), Espoo, Finland, 2016.

W. C. Chew, *Waves and Field in Inhomogeneous Media*, IEEE Press, 1995.

W. C. Chew, *Waves and Fields in Inhomogenous Media*, IEEE Press, 1999.

W. C. Chew, J.-M. Jin, E. Michielssen, and J. Song, (ed.) *Fast and Efficient Algorithms in Computational Electromagnetics*, Norwood: Artech House, 2001.

W. Wu, A. W. Glisson, and D. Kajfez, "A comparison of two low frequency formulations for the electric field integral equation," in Proc. 10th Annu. Review of Progress in Applied Computational Electromagnetics, vol. 2, Monterey, Calif., March 1994, pp. 484-491.

Z. G. Qian, "Augmented surface integral equation method for low frequency electromagnetic analysis," Ph.D. dissertation, Univ. Illinois at Urbana-Champaign, Champaign, Ill., USA, 2009.

Z. G. Qian and W. C. Chew, "Fast full-wave surface integral equation solver for multiscale structure modeling," IEEE Trans. Antennas Propagation, vol. 50, pp. 35943601, November 2009.

Z. G. Qian, W. C. Chew, and R. Suaya, "Generalized impedance boundary condition for conductor modeling in surface integral equation," IEEE Trans. Microw. Theory Techn., Vol. 55, No. 11, pp. 2354-2364, November 2007.

The invention claimed is:

1. A method of evaluating an electrical disturbance within a power system comprising a power conductor supported by a supporting infrastructure defining a three-dimensional object having a prescribed boundary, the method comprising:
   calculating the electric field in relation to the supporting infrastructure by:
   (i) representing the electric field integral equation as a single source integral equation which uses one or both of electric type waves and magnetic field type waves emanating from the boundary of the object weighted by a single function defined on the boundary; and
   (ii) using the electric field integral equation to solve for the electric field; and
   locating any faults in the power system by calculating charge distribution in the power system using the calculated electric field.

2. The method according to claim 1 including deriving the single source integral equation using a volume electric field integral equation by translating said one or both of the electric type waves and the magnetic field type waves from the boundary to a volume of the object and back to the boundary of the object.

3. The method according to claim 1 deriving the single source integral equation from a volume electric field integral equation by representing total electric field inside the boundary of the object as a superposition of said one or both of the electric type waves and the magnetic field type waves emanating from the boundary of the object.

4. The method according to claim 1 wherein the electric type waves comprise an electric field produced by an electric dipole and the magnetic field type waves comprise a magnetic field produced by an electric dipole.

5. The method according to claim 1 wherein only the electric type waves are used in representing the electric field integral equation.

6. The method according to claim 1 wherein both of the electric type waves and the magnetic type waves are used in representing the electric field integral equation.

7. The method according to claim 1 wherein the single function is a tangential vector function defined on the boundary.

8. The method according to claim 1 further comprising modifying the power system to correct for any faults located.

9. The method according to claim 1 further including deriving the single source integral equation using a volume electric field integral equation by (i) translating said one or both of the electric type waves and the magnetic field type waves from the boundary to a volume of the object and back to the boundary of the object and (ii) representing total electric field inside the boundary of the object as a superposition of said one or both of the electric type waves and the magnetic field type waves emanating from the boundary of the object, wherein at least the electric type waves are used in representing the electric field integral equation, wherein the electric type waves comprise an electric field produced by an electric dipole and the magnetic field type waves comprise a magnetic field produced by an electric dipole, and wherein the single function is a tangential vector function defined on the boundary.

10. A method of remote sensing a stratified structure defining a three-dimensional object having a prescribed boundary using a radar wave emanating from a satellite and propagating through the stratified structure, the method comprising:
   calculating the electric field in relation to the stratified structure by:
   (i) representing the electric field integral equation as a single source integral equation which uses one or both of electric type waves and magnetic field type waves emanating from the boundary of the object weighted by a single function defined on the boundary; and
   (ii) using the electric field integral equation to solve for the electric field; and
   identifying a configuration of layers within the stratified structure using the calculated electric field.

11. The method according to claim 10 wherein the stratified structure includes a layer of ice.

12. The method according to claim 10 including deriving the single source integral equation using a volume electric field integral equation by translating said one or both of the electric type waves and the magnetic field type waves from the boundary to a volume of the object and back to the boundary of the object.

13. The method according to claim 10 deriving the single source integral equation from a volume electric field integral equation by representing total electric field inside the boundary of the object as a superposition of said one or both of the electric type waves and the magnetic field type waves emanating from the boundary of the object.

14. The method according to claim 10 wherein the electric type waves comprise an electric field produced by an electric dipole and the magnetic field type waves comprise a magnetic field produced by an electric dipole.

15. The method according to claim 10 wherein only the electric type waves are used in representing the electric field integral equation.

16. The method according to claim 10 wherein both of the electric type waves and the magnetic type waves are used in representing the electric field integral equation.

17. The method according to claim 10 wherein the single function is a tangential vector function defined on the boundary.

18. The method according to claim 10 further including deriving the single source integral equation using a volume electric field integral equation by (i) translating said one or both of the electric type waves and the magnetic field type waves from the boundary to a volume of the object and back to the boundary of the object and (ii) representing total electric field inside the boundary of the object as a superposition of said one or both of the electric type waves and the magnetic field type waves emanating from the boundary of the object, wherein at least the electric type waves are used in representing the electric field integral equation, wherein the electric type waves comprise an electric field produced by an electric dipole and the magnetic field type waves comprise a magnetic field produced by an electric dipole, and wherein the single function is a tangential vector function defined on the boundary.

19. A method of designing a circuit comprising a chip communicating with a circuit board, at least a portion of the circuit comprising conductive wires defining a three-dimensional object having a prescribed boundary, the method including:
   calculating the electric field in relation to the conductive wires by:
   (i) representing the electric field integral equation as a single source integral equation which uses one or both of electric type waves and magnetic field type waves emanating from the boundary of the object weighted by a single function defined on the boundary; and (ii) using the electric field integral equation to solve for the electric field; and identifying communication rate limitations in the circuit using the calculated electric field.

20. The method according to claim 19 further comprising modifying a configuration of the circuit to overcome the identified communication rate limitations.

21. The method according to claim 20 further comprising modifying the configuration of the circuit by re-routing the conductive wires of the electronic package.

22. The method according to claim 20 further comprising modifying the configuration of the circuit by providing electromagnetic shielding between some of the conductive wires.

23. The method according to claim 19 including deriving the single source integral equation using a volume electric field integral equation by translating said one or both of the electric type waves and the magnetic field type waves from the boundary to a volume of the object and back to the boundary of the object.

24. The method according to claim 19 deriving the single source integral equation from a volume electric field integral equation by representing total electric field inside the boundary of the object as a superposition of said one or both of the electric type waves and the magnetic field type waves emanating from the boundary of the object.

25. The method according to claim 19 wherein the electric type waves comprise an electric field produced by an electric dipole and the magnetic field type waves comprise a magnetic field produced by an electric dipole.

26. The method according to claim 19 wherein only the electric type waves are used in representing the electric field integral equation.

27. The method according to claim 19 wherein both of the electric type waves and the magnetic type waves are used in representing the electric field integral equation.

28. The method according to claim 19 wherein the single function is a tangential vector function defined on the boundary.

29. The method according to claim 19 further including deriving the single source integral equation using a volume electric field integral equation by (i) translating said one or both of the electric type waves and the magnetic field type waves from the boundary to a volume of the object and back to the boundary of the object and (ii) representing total electric field inside the boundary of the object as a superposition of said one or both of the electric type waves and the magnetic field type waves emanating from the boundary of the object, wherein at least the electric type waves are used in representing the electric field integral equation, wherein the electric type waves comprise an electric field produced by an electric dipole and the magnetic field type waves comprise a magnetic field produced by an electric dipole, and wherein the single function is a tangential vector function defined on the boundary.

* * * * *